(12) United States Patent
Kim

(10) Patent No.: US 7,524,714 B2
(45) Date of Patent: Apr. 28, 2009

(54) METHOD FOR MANUFACTURING SEMICONDUCTOR DEVICE

(75) Inventor: Dae Kyeun Kim, Chungcheongnam-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 146 days.

(21) Appl. No.: 11/567,106

(22) Filed: Dec. 5, 2006

(65) Prior Publication Data

US 2007/0148887 A1 Jun. 28, 2007

(30) Foreign Application Priority Data

Dec. 28, 2005 (KR) .................. 10-2005-0132326

(51) Int. Cl.
*H01L 21/338* (2006.01)
*H01L 21/336* (2006.01)
(52) U.S. Cl. ...................... 438/174; 438/197
(58) Field of Classification Search ............... 438/197, 438/299, 303, 306, 174, 514, 163
See application file for complete search history.

(56) References Cited

U.S. PATENT DOCUMENTS

| 5,986,305 | A | * | 11/1999 | Wu | ........................... | 257/344 |
| 6,723,623 | B1 | * | 4/2004 | Nguyen | ..................... | 438/525 |
| 7,154,154 | B2 | * | 12/2006 | Lee et al. | .................... | 257/408 |

* cited by examiner

*Primary Examiner*—David S Blum
(74) *Attorney, Agent, or Firm*—Sherr & Vaughn, PLLC

(57) ABSTRACT

Embodiments relate to a method for manufacturing a semiconductor device. According to embodiments, a gate insulating layer and a conductive layer may be formed on a semiconductor substrate. The conductive layer may be selectively etched to form a relatively thick portion of the conductive layer in a gate region and relatively thin portions of the conductive layer in other regions. Impurity ions may be implanted in an entire surface of the semiconductor substrate to form a lightly doped drain region. The gate insulating layer and the conductive layer may be selectively etched to form a gate electrode. Insulating layer sidewalls may be formed at both sides of the gate electrode, and source/drain regions may be formed in portions of the semiconductor substrate located at both sides of the gate electrode.

19 Claims, 10 Drawing Sheets

METHOD FOR MANUFACTURING SEMICONDUCTOR DEVICE

The present application claims priority under 35 U.S.C. 119 and 35 U.S.C. 365 to Korean Patent Application No. 10-2005-0132326 (filed on Dec. 28, 2005), which is hereby incorporated by reference in its entirety.

BACKGROUND

Embodiments relate to a method for manufacturing a semiconductor device.

As semiconductor devices become more highly integrated, a size of the internal transistors has been gradually reduced. However, there may a limitation regarding how much a junction depth of a source/drain of a transistor can be reduced.

This is because a channel length reduces from a long channel to a short channel of a length less than 0.5 μm, a depletion region of the source/drain may penetrate into the channel to shorten an effective channel length, reduce a threshold voltage, and may thus cause a short channel effect, which may ultimately lead to a loss of a gate control over the metal oxide semiconductor (MOS) transistor.

There may be ways to reduce or prevent the short channel effect. For example, reducing a thickness of a gate insulating layer and a maximum width of a channel between a source and a drain, i.e., a maximum width of a depletion region under a gate, and reducing impurity concentration within the semiconductor substrate may help to reduce or prevent the short channel effect.

It may also be important to form a shallow junction. For this purpose, an ion implantation apparatus and a subsequent heat treatment process for forming a shallow junction in a manufacturing process of a semiconductor device are being developed.

A related art method for manufacturing a semiconductor device will be described below with reference to the accompanying drawings.

FIGS. 1A to 1E are cross-sectional illustrations of a related art method for manufacturing a semiconductor device.

Referring to FIG. 1A, semiconductor substrate 21 may include an active region and a device isolation region. Device isolation layer 22 may be formed in the device isolation region through a local oxidation of silicon (LOCOS) or a shallow trench isolation (STI) process.

Semiconductor substrate 21 may be thermally oxidized at a high temperature to form the gate oxide layer 23, and a polysilicon layer may be deposited on the gate oxide layer 23.

Also, the polysilicon layer and the gate oxide layer may be selectively etched, for example by a photolithography process to form gate electrode 24.

Referring to FIG. 1B, oxide layer 25 may be formed on a surface of semiconductor substrate 21 including gate electrode 24.

Low concentration impurity ions may be implanted into an entire surface of semiconductor substrate 21 using gate electrode 24 as a mask, and may form lightly doped drain (LDD) region 26 in portions of semiconductor substrate 21 located at both sides of gate electrode 24.

LDD region 26 may expand into a portion of the semiconductor substrate located under the gate electrode through diffusion of the impurity ions, and may overlap gate electrode 24.

Referring to FIG. 1C, oxide layer 25 may be removed, and first insulating layer 27 and second insulating layer 28, which may have different etch selectivities may be sequentially formed on a surface of semiconductor substrate 21 including gate electrode 24.

First insulating layer 27 may be formed of oxide and second insulating layer 28 may be formed of nitride.

Removal of oxide layer 25 may influence a quality of gate oxide layer 23, may increase the divot depth of the device, and thus may influence the device performance.

Referring to FIG. 1D, an etch back process may be performed on entire surfaces of first and second insulating layers 27 and 28 to form first and a second insulating layer sidewalls 27a and 28a.

Referring to FIG. 1E, high concentration impurity ions may be implanted into an entire surface of semiconductor substrate 21 using gate electrode 24, first insulating layer sidewall 27a, and second insulating layer sidewall 28a as a mask and may form source/drain impurity regions 29 connected to LDD region 26 in semiconductor substrate 21.

Thereafter, though not shown, an interlayer insulating layer, a metal line and the like may be formed to complete a logic process.

However, a related art method for manufacturing a semiconductor device may have certain problems.

For example, the overlapping of the LDD region and a bottom of the gate electrode may cause gate induced drain leakage (GIDL) and parasitic capacitance, which may deteriorate the performance of a device.

Also for example, because only the oxide layer formed on the entire surface of the semiconductor substrate serves as a barrier when the LDD region is formed, the barrier oxide layer may not assist a process related to forming a shallow junction aside from providing surface protection.

SUMMARY

Embodiments may relate to a method for manufacturing a semiconductor device that may have a shallow junction.

Embodiments may relate to a method for manufacturing a semiconductor device that may simplify a manufacturing process.

In embodiments, a method for manufacturing a semiconductor device may include forming a gate insulating layer and a conductive layer on a semiconductor substrate, selectively etching the conductive layer to form a relatively thick portion of the conductive layer in a gate region and relatively thin portions of the conductive layer in other regions, implanting impurity ions in an entire surface of the semiconductor substrate to form a lightly doped drain region, selectively etching the gate insulating layer and the conductive layer to form a gate electrode, forming insulating layer sidewalls at both sides of the gate electrode, and forming source/drain regions in portions of the semiconductor substrate located at both sides of the gate electrode.

In embodiments, a method for manufacturing a semiconductor device may include forming a gate insulating layer and a conductive layer on a semiconductor substrate, selectively etching the conductive layer to form a relatively thick portion of the conductive layer in a gate region and relatively thin portions of the conductive layer in other regions, implanting impurity ions in an entire surface of the semiconductor substrate to form a lightly doped drain region, selectively etching the gate insulating layer, a sidewall of the relatively thick portion of the conductive layer in the gate region and the relatively thin portions of the conductive layer to form a gate electrode, forming insulating layer sidewalls at both sides of the gate electrode, and forming source/drain regions in portions of the semiconductor substrate located at both sides of the gate electrode.

In embodiments, a method for manufacturing a semiconductor device may include forming a gate insulating layer and a conductive layer on a semiconductor substrate, etching portions of the conductive layer to leave a portion of the conductive layer that is located in a gate region, implanting impurity ions in an entire surface of the semiconductor substrate to form a lightly doped drain region, etching the gate insulating layer and the portion of the conductive layer that is located in the gate region to form a gate electrode, forming insulating layer sidewalls at both sides of the gate electrode, and forming source/drain regions in portions of the semiconductor substrate located at both sides of the gate electrode.

DETAILED DESCRIPTION PREFERRED EMBODIMENTS

Figure 1A:
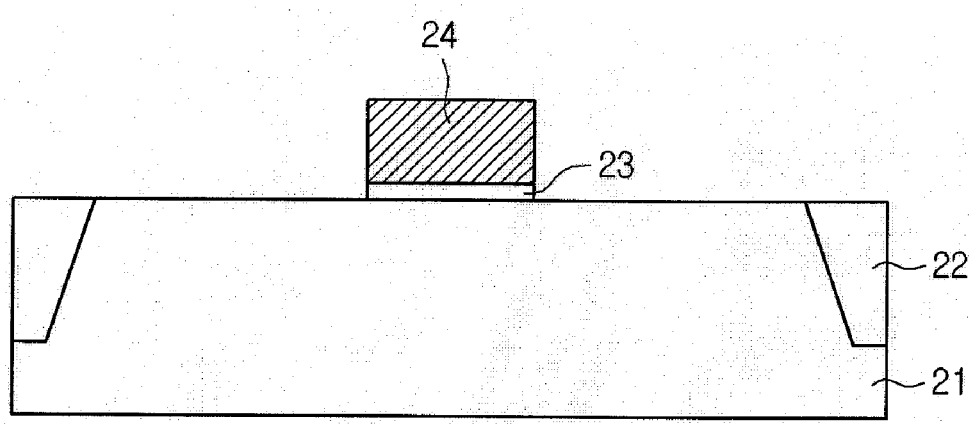
FIGS. 1A to 1E are example cross-sectional illustrations of a related art method for manufacturing a semiconductor device.
Figure 1B:
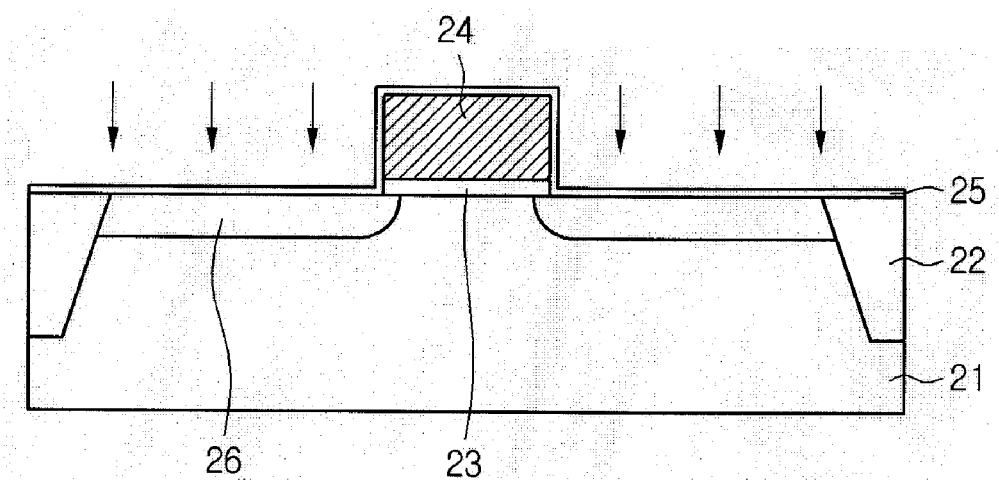
Figure 1C:
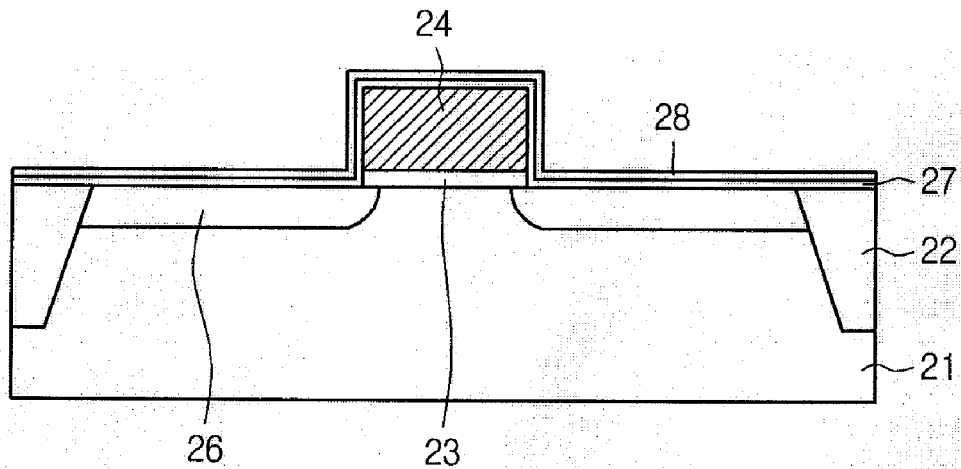
Figure 1D:
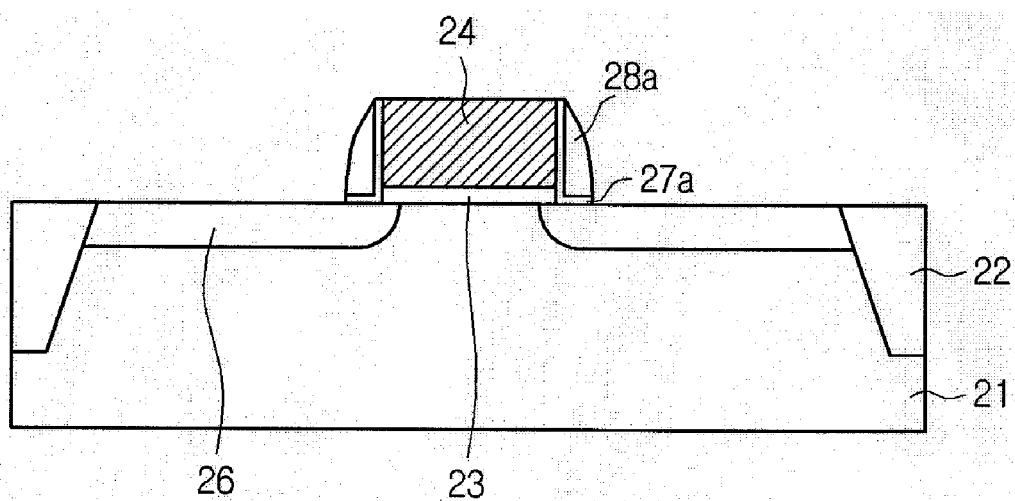
Figure 1E:
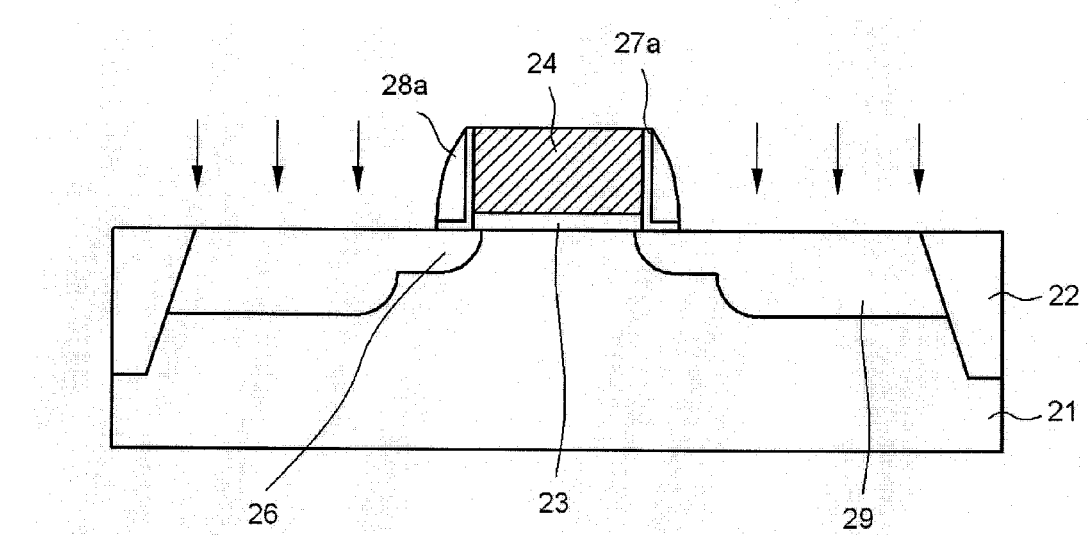
Figure 2A:
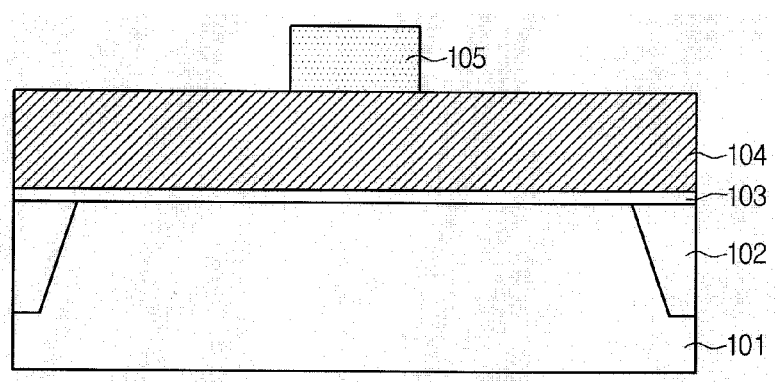
FIGS. 2A to 2G example are cross-sectional illustrations of a method for manufacturing a semiconductor device according to embodiments.

Referring to FIG. 2A, semiconductor substrate 101 may include an active region and a device isolation region. Device isolation layer 102 may be formed in the device isolation region using, for example, local oxidation of silicon (LOCOS) or a shallow trench isolation (STI) process.

Semiconductor substrate 101 may be thermally oxidized at a high temperature to form gate oxide layer 103 on semiconductor substrate 101. In embodiments, gate oxide layer 103 may have a thickness of approximately 30~80 Å.

In embodiments, a deposition process such as chemical vapor deposition (CVD) as well as thermal oxidation may be used to form gate oxide layer 103.

Conductive layer 104, for example formed of polysilicon or the like, for forming a gate electrode may be formed on gate oxide layer 103. Photoresist 105 may be coated on conductive layer 104, and photoresist 105 may be selectively patterned by a light exposure and development process, for example, to define a gate region.

Figure 2B:
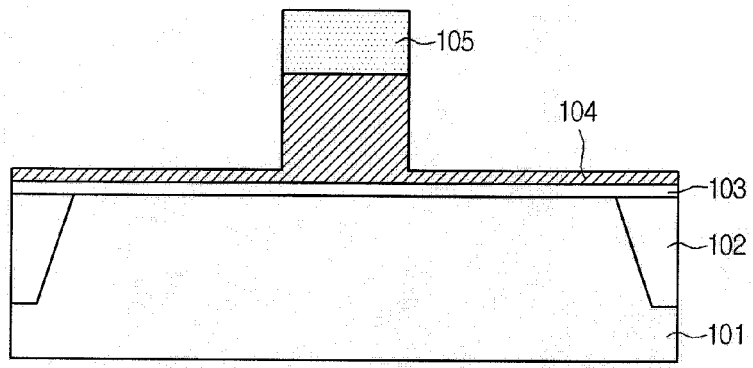

Referring to FIG. 2B, conductive layer 104 may be selectively removed from a surface by a prescribed thickness through anisotropic etching using patterned photoresist 105 as a mask. A portion of conductive layer 104 located in a gate region (e.g. below photoresist 105) may have a thickness different than a thickness of other portions of conductive layer 104 (e.g. portions not below photoresist 105). That is, an area masked by photoresist 105 may be covered with a thicker portion of conductive layer 104 compared to an area free of photoresist 105.

Figure 2C:
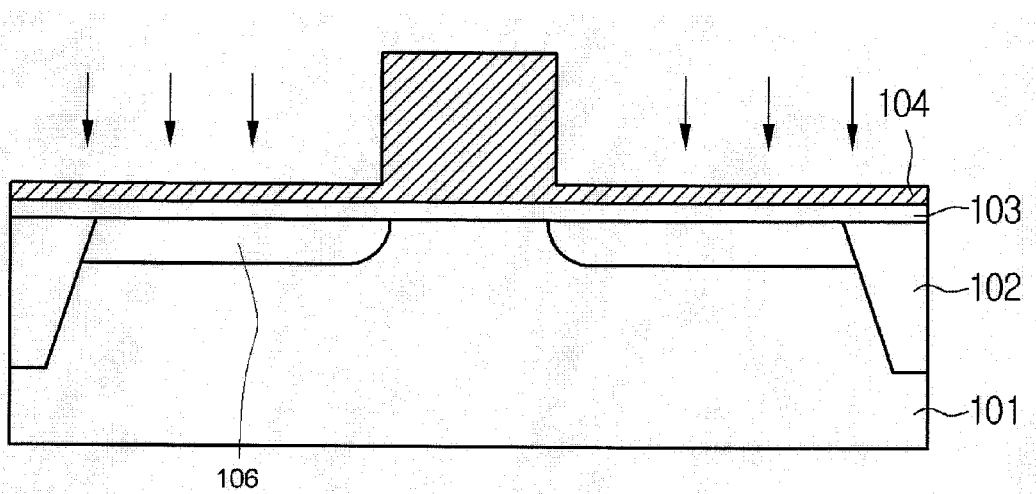

Referring to FIG. 2C, photoresist 105 may be removed. Low concentration impurity ions may then be implanted into a surface of semiconductor substrate 101 using conductive layer 104 (having different thicknesses) as a mask. LDD region 106 may thereby be formed in a portion of semiconductor substrate 101 that is located under a thinner portion of conductive layer 104. In embodiments, low concentration impurity ions may be implanted into an entire surface of semiconductor substrate 101.

In embodiments, gate oxide layer 103 as well as the thinner portion of conductive layer 104 may serve as a barrier while the LDD region 106 is formed.

An amount of implanted impurity ions may therefore be decreased to minimize an expansion of LDD region 106 into a portion under the gate electrode and may minimize an overlapping of the LDD region and a gate electrode.

Figure 2D:
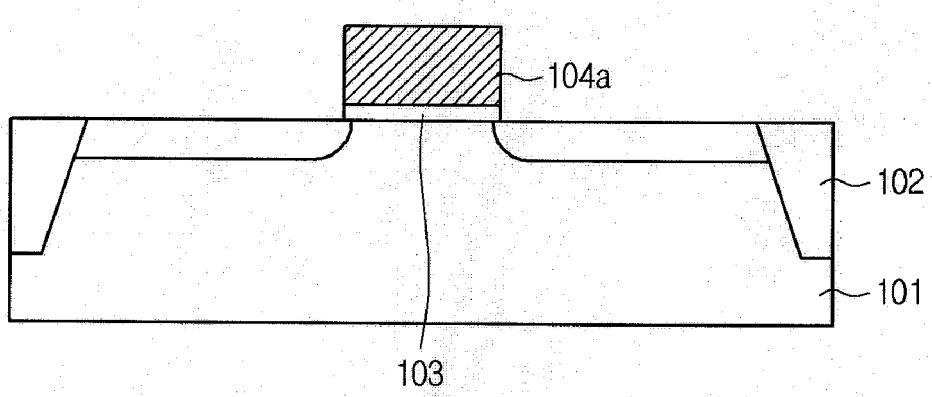

Referring to FIG. 2D, blanket etching may be performed on a surface, for example an entire surface, of conductive layer 104 without a mask. The thinner portion of conductive layer 104 and gate oxide layer 103 may thus be selectively removed to form a gate electrode 104a.

In embodiments, a thicker portion of conductive layer 104 may also removed by a prescribed thickness during the blanket etching.

Figure 2E:
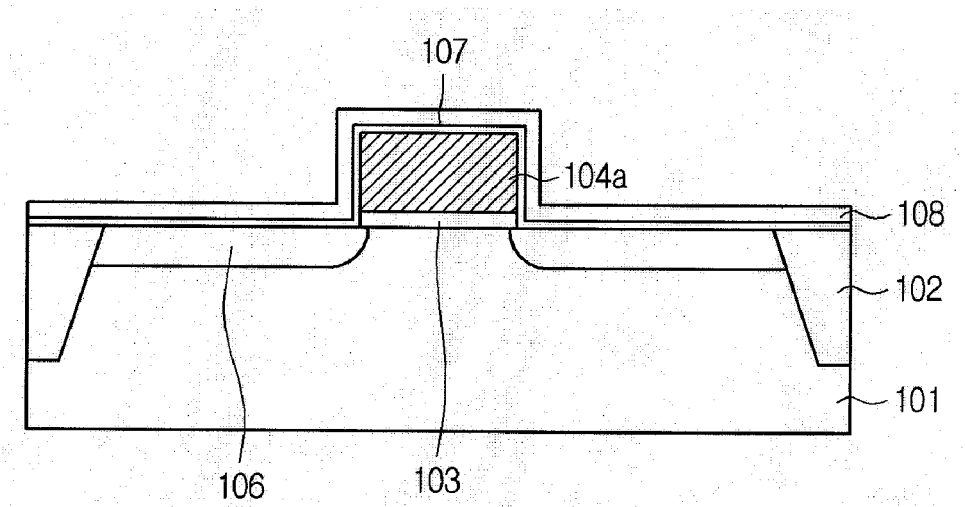

Referring to FIG. 2E, first insulating layer 107 and second insulating layer 108, which may have etch selectivities different from each other, may be sequentially formed on a surface of semiconductor substrate 101 including gate electrode 104a. In embodiments, first insulating layer 107 and second insulating layer 108 may be sequentially formed over an entire surface of semiconductor substrate 101.

In embodiments, first insulating layer 107 may be formed of oxide, and second insulating layer 108 may be formed of nitride.

In embodiments, both first and second insulating layers 107 and 108 may be formed. In embodiments, only one insulating layer may also be formed.

Figure 2F:
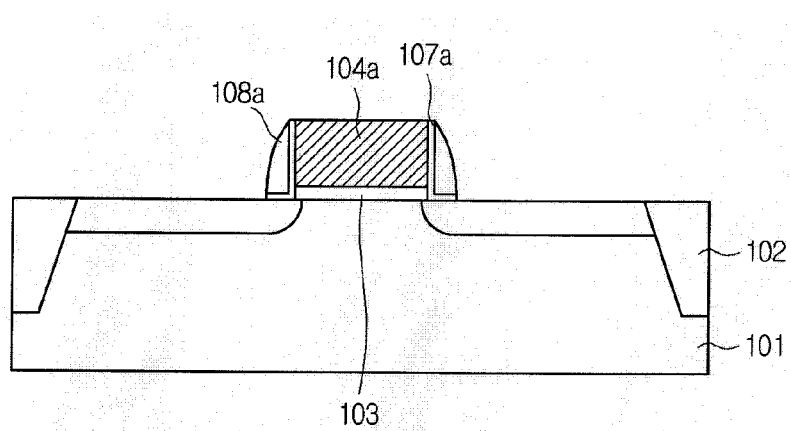

Referring to FIG. 2F, an etch back process may be performed on surfaces, for example the entire surfaces, of first insulating layer 107 and second insulating layer 108, and may form first insulating layer sidewall 107a and second insulating layer sidewall 108a on respective lateral sides of gate electrode 104a.

Figure 2G:
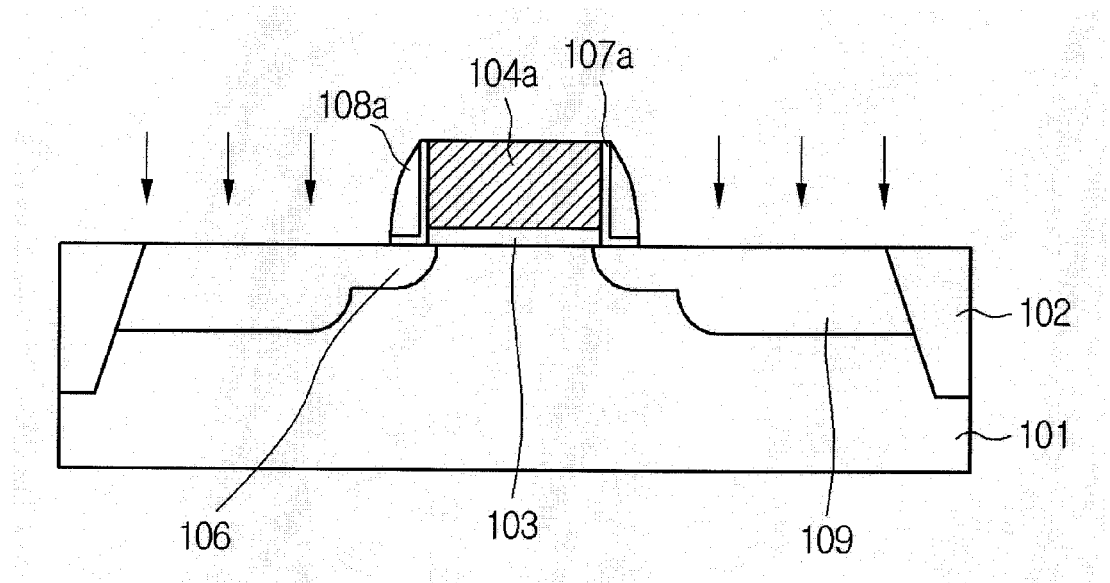

Referring to FIG. 2G, high concentration impurity ions may be implanted in a surface, for example an entire surface, of semiconductor substrate 101. Gate electrode 104a, first insulating layer sidewall 107a, and second insulating layer sidewall 108a may be used as a mask. Source/drain impurity regions 109 that may be connected to LDD region 106 in semiconductor substrate 101 may thereby be formed.

Thereafter, though not shown, an interlayer insulating layer, a metal line and the like may be formed using general processes to complete a logic process.

FIGS. 3A to 3G are cross-sectional views illustrating a method for manufacturing a semiconductor device according to embodiments.

Figure 3A:
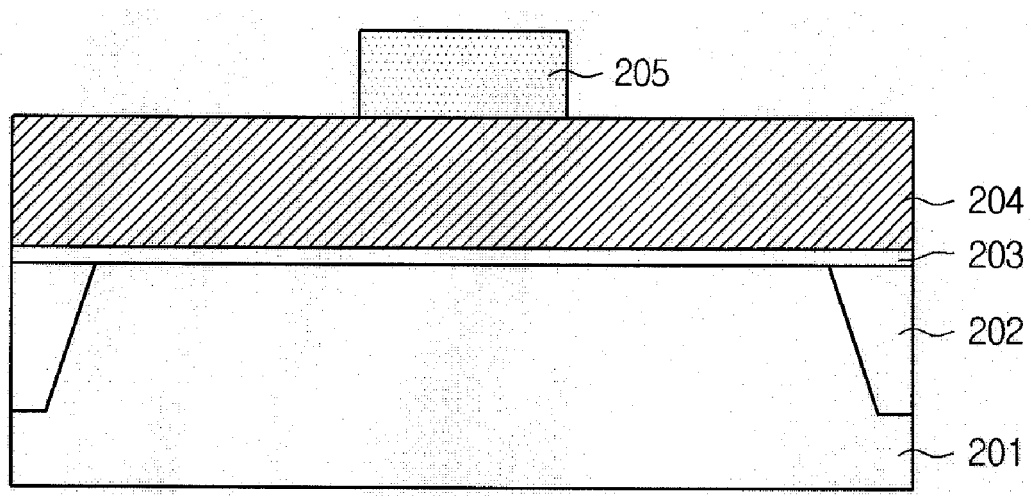
FIGS. 3A to 3G are example cross-sectional illustrations of a method for manufacturing a semiconductor device according to embodiments.

Referring to FIG. 3A, semiconductor substrate 201 may include an active region and a device isolation region. Device isolation layer 202 may be formed in the device isolation region through a LOCOS or STI process, according to embodiments.

Semiconductor substrate 201 may be thermally oxidized at a high temperature, which may form gate oxide layer 203 on semiconductor substrate 201. In embodiments, gate oxide layer 203 may have a thickness of approximately 30~80 Å

In embodiments, a deposition process such as CVD as well as thermal oxidation may be used to form gate oxide layer 203.

Subsequently, conductive layer 204, for example made of polysilicon or the like, for forming a gate electrode may be formed on gate oxide layer 203. Photoresist 205 may be coated on conductive layer 204. Photoresist 205 may be selectively patterned, for example, by a light exposure and development process to define a gate region.

Figure 3B:
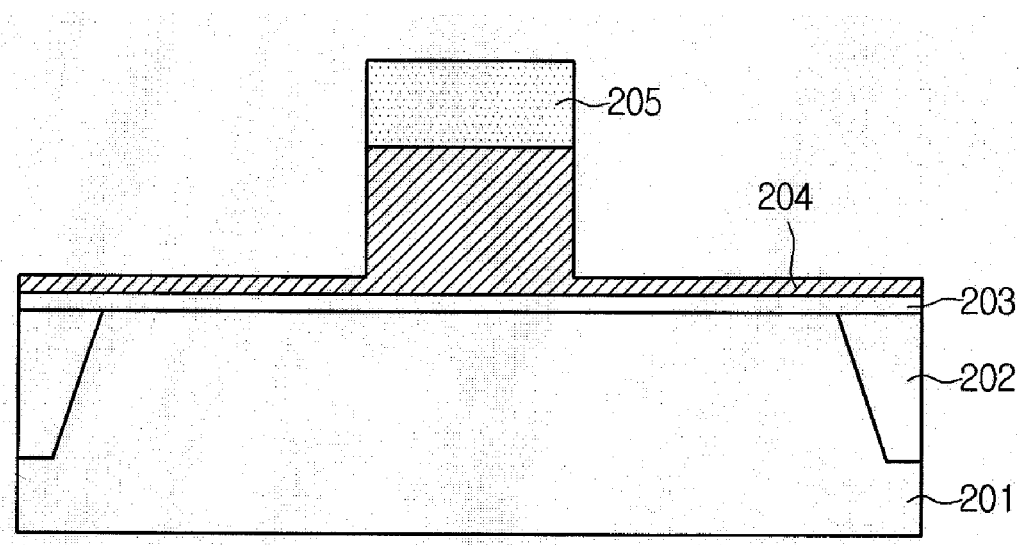

Referring to FIG. 3B, conductive layer 204 may be selectively removed from a surface by a prescribed thickness, for example through anisotropic etching using the patterned photoresist 205 as a mask. A portion of conductive layer 204 located in a gate region may therefore have a thickness different from that of other portions of conductive layer 204. That is, an area masked by photoresist 205 may be covered with a thicker conductive layer as compared to an area not masked by photoresist 205.

Figure 3C:
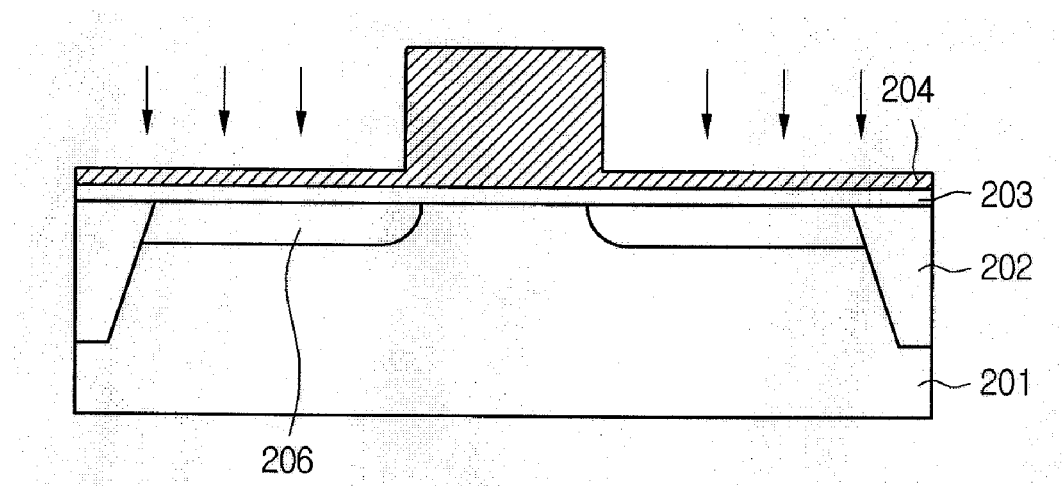

Referring to FIG. 3C, photoresist 205 may be removed. Low concentration impurity ions may be implanted into a surface, for example an entire surface, of semiconductor substrate 201. Conductive layer 204 having different thicknesses may be used as a mask. LDD region 206 may thus be formed in a portion of semiconductor substrate 201 that corresponds to a portion under a thinner portion of conductive layer 204.

In embodiments, a gate oxide layer 203 as well as the thinner portion of conductive layer 204 may serve as a barrier while LDD region 206 is being formed.

The low concentration impurity ions may be implanted into the surface of the semiconductor substrate through the lateral sides of the portion of conductive layer 204 that is located in the gate region, while the LDD region 206 is being formed.

In embodiments, an LDD region 206 may be formed under conductive layer 204 in the gate region to overlap the gate region.

Figure 3D:
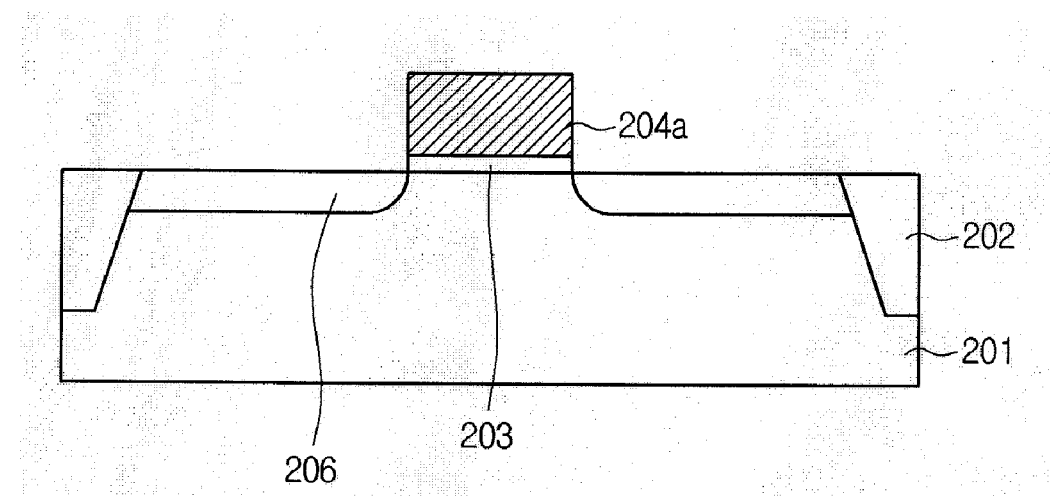

Referring to FIG. 3D, a blanket etching may be performed on a surface, for example the entire surface, of conductive layer 204 without a mask. The thinner portion of conductive layer 204 and gate oxide layer 203 may thus be selectively removed and gate electrode 204a may be formed.

The lateral sides of conductive layer 204 may be etched by adjusting the lateral side etch rate during the blanket etching.

That is, the portion of conductive layer 204 that is located in the gate region may be formed to have a width greater than that of the desired gate electrode 204a during the process illustrated in FIG. 3B. After LDD region 206 may be formed, the lateral sides of the portion of conductive layer 204 that are located in the gate region may be etched. A resultant conductive layer may have the same width as the desired gate electrode 204a and LDD region 206 may be prevented from overlapping gate electrode 204a.

Figure 3E:
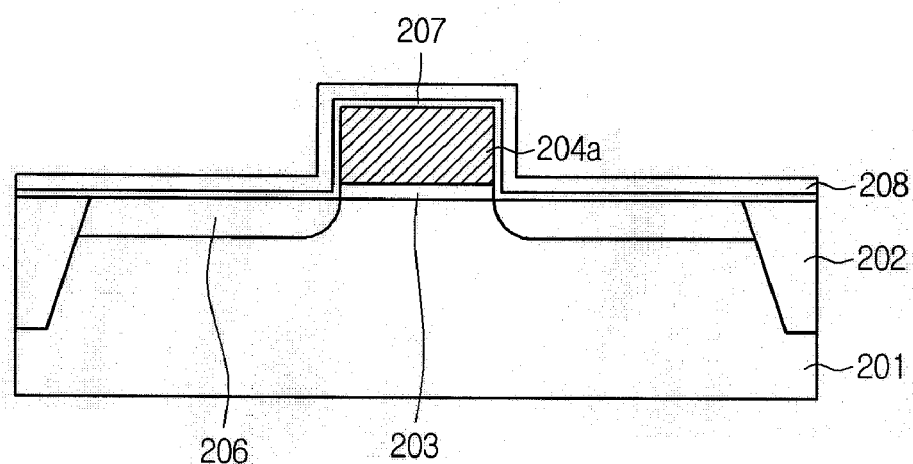

Referring to FIG. 3E, first insulating layer 207 and second insulating layer 208, which may have etch selectivities different from each other, may be sequentially formed on a surface of semiconductor substrate 201 including the gate electrode 204a. In embodiments, first insulating layer 207 and second insulating layer 208 may be sequentially formed on an entire surface of semiconductor substrate 201 including the gate electrode 204a.

In embodiments, first insulating layer 207 may be formed of oxide, and second insulating layer 208 may be formed of nitride.

In embodiments, both first and second insulating layers 207 and 208 may be formed. In embodiments, only one insulating layer may be formed.

Figure 3F:
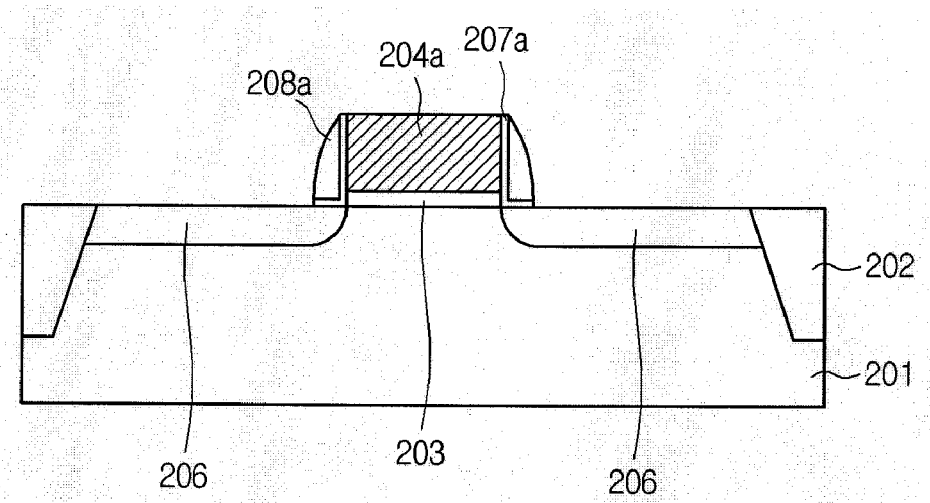

Referring to FIG. 3F, an etch back process may be performed on surfaces, for example the entire surfaces, of the first insulating layer 207 and second insulating layer 208, and may form first insulating layer sidewall 207a and second insulating layer sidewall 208a on respective lateral sides of the gate electrode 204a.

Figure 3G:
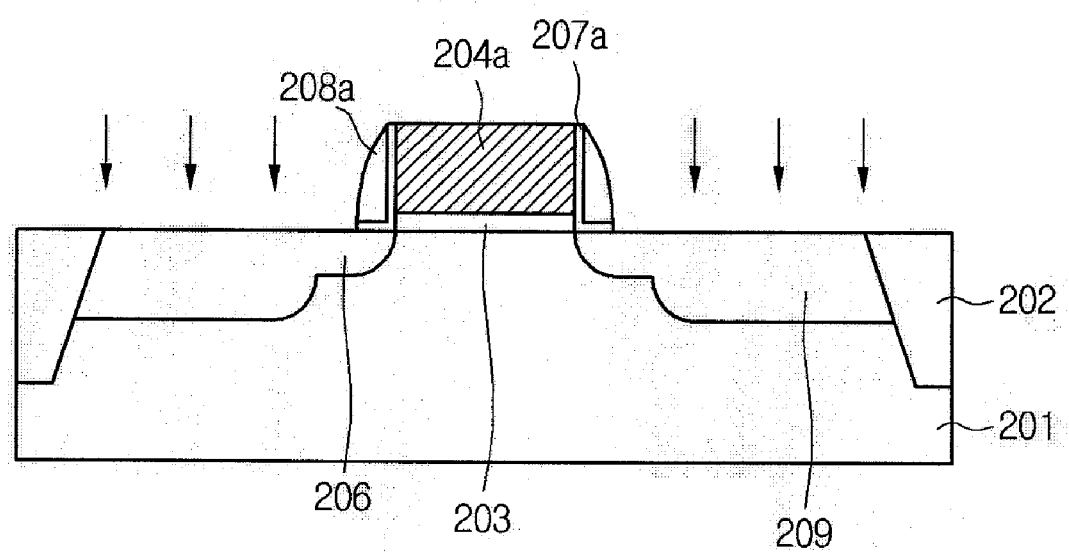

Referring to FIG. 3G, high concentration impurity ions may be implanted in a surface, for example an entire surface, of semiconductor substrate 201 and may use gate electrode 204a, first insulating layer sidewall 207a, and second insulating layer sidewall 208a as a mask to form source/drain impurity regions 209 that may be connected to LDD region 206 in semiconductor substrate 201.

Thereafter, though not shown, an interlayer insulating layer, a metal line and the like may be formed using general processes to complete a logic process.

According to embodiments, a method for manufacturing a semiconductor device may have certain benefits.

For example, according to embodiments, a conductive layer for a gate electrode and a gate oxide layer may be used as a barrier and may prevent an LDD region from overlapping the gate electrode. This may reduce GIDL, may remove parasitic capacitance, and may therefore enhance a performance and reliability of a device.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
    forming a gate insulating layer and a conductive layer over a semiconductor substrate;
    forming a first portion of the conductive layer in a gate region to have a first thickness and a second portion of the conductive layer not in the gate region to have a second thickness, the first thickness being greater than the second thickness;
    implanting impurity ions into a surface of the semiconductor substrate to form a lightly doped drain region overlapping the first portion of the conductive layer;
    forming a gate electrode by selectively etching the sidewalls of the first portion and the gate insulating layer such that the lightly doped drain region does not overlap the first portion of the conductive layer;
    forming insulating layer sidewalls at both sides of the gate electrode; and
    forming source/drain regions in portions of the semiconductor substrate located at both sides of the gate electrode.

2. The method of claim 1, wherein the first and second portions of the conductive layer are formed by selectively etching the conductive layer.

3. The method of claim 1, wherein the insulating layer sidewalls comprise bilayered sidewalls.

4. The method of claim 3, wherein the bilayered sidewalls are formed by sequentially forming a first insulating layer and a second insulating layer having etch selectivities different from each other and performing an etch back process on at least a portion of the first and second insulating layers.

5. The method of claim 4, wherein the first insulating layer comprises oxide and the second insulating layer comprises nitride.

6. The method of claim 1, wherein the conductive layer comprises polysilicon.

7. The method of claim 1, wherein the gate insulating layer has a thickness of 30~80 Å.

8. A method comprising:
    forming a gate insulating layer over a semiconductor substrate;
    forming a conductive layer having a first portion over a gate region of the semiconductor substrate and a second portion over other regions of the semiconductor substrate, the first portion having a first thickness and the second portion having a second thickness, the first thickness being greater than the second thickness;

implanting impurity ions into a surface of the semiconductor substrate to form a lightly doped drain region overlapping the gate region;

selectively etching the gate insulating layer, sidewalls of the first portion of the conductive layer, and the second portion of the conductive layer to form a gate electrode that does not overlap the lightly doped drain region;

forming insulating layer sidewalls at both sides of the gate electrode; and forming source/drain regions in portions of the semiconductor substrate located at both sides of the gate electrode.

9. The method of claim 8, wherein the first and second portions of the conductive layer are formed by selectively etching the conductive layer.

10. The method of claim 8, wherein the insulating layer sidewall comprise bilayered sidewall.

11. The method of claim 10, wherein the bilayered sidewalls are formed by sequentially forming a first insulating layer and a second insulating layer having etch selectivities different from each other and performing an etch back process on surfaces of the first and second insulating layers.

12. The method of claim 11, wherein the first insulating layer comprises oxide and the second insulating layer comprises nitride.

13. The method of claim 8, wherein the conductive layer comprises polysilicon.

14. The method of claim 8, wherein the gate insulating layer has a thickness of 30~80 Å.

15. A method comprising:

forming a gate insulating layer over a semiconductor substrate;

forming a conductive layer over only a gate region of the semiconductor substrate;

implanting impurity ions into a surface of the semiconductor substrate to form a lightly doped drain region overlapping the gate region;

forming a gate electrode by reducing a width of the portion of the conductive layer that is located in the gate region such that the lightly doped drain region does not overlap the gate electrode;

forming insulating layer sidewalls at both sides of the gate electrode; and forming source/drain regions in portions of the semiconductor substrate located at both sides of the gate electrode.

16. The method of claim 15, wherein forming the conductive layer over only the gate region of the semiconductor substrate comprises etching portions of the conductive layer to leave only the portion of the conductive layer located in the gate region.

17. The method of claim 15, wherein the gate electrode is formed by etching the gate insulating layer and a portion of the conductive layer.

18. The method of claim 15, wherein forming the gate electrode comprises etching sidewalls of the conductive layer.

19. The method of claim 15, wherein the gate electrode is formed by performing blanket etching on the gate insulating layer and the conductive layer without a mask.

* * * * *